United States Patent
Xu et al.

(10) Patent No.: US 10,910,303 B2
(45) Date of Patent: Feb. 2, 2021

(54) PACKAGE STRUCTURE AND MANUFACTURING METHOD THEREOF

(71) Applicant: Delta Electronics Int'l (Singapore) Pte Ltd, Singapore (SG)

(72) Inventors: Xiaofeng Xu, Singapore (SG); Beng Beng Lim, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/538,938

(22) Filed: Aug. 13, 2019

(65) Prior Publication Data

US 2020/0203268 A1 Jun. 25, 2020

(30) Foreign Application Priority Data

Dec. 24, 2018 (SG) .......................... 10201811582W

(51) Int. Cl.
| | |
|---|---|
| H01L 23/498 | (2006.01) |
| H01L 23/538 | (2006.01) |
| H01L 21/48 | (2006.01) |
| H01L 21/56 | (2006.01) |
| H01L 23/00 | (2006.01) |

(52) U.S. Cl.
CPC .... *H01L 23/49861* (2013.01); *H01L 21/4853* (2013.01); *H01L 21/56* (2013.01); *H01L 23/49866* (2013.01); *H01L 23/5386* (2013.01); *H01L 23/5389* (2013.01); *H01L 24/19* (2013.01); *H01L 24/20* (2013.01); *H01L 24/48* (2013.01); *H01L 2224/221* (2013.01); *H01L 2224/48091* (2013.01); *H01L 2224/48106* (2013.01); *H01L 2224/48245* (2013.01)

(58) Field of Classification Search
CPC combination set(s) only.
See application file for complete search history.

(56) References Cited

U.S. PATENT DOCUMENTS

| | | | |
|---|---|---|---|
| 2006/0145328 A1* | 7/2006 | Hsu ........................ | H05K 1/185 257/690 |
| 2012/0205790 A1* | 8/2012 | Haga ....................... | H01L 24/29 257/676 |
| 2018/0040543 A1* | 2/2018 | Ishibashi ........... | H01L 23/49582 |

* cited by examiner

*Primary Examiner* — Jasmine J Clark
(74) *Attorney, Agent, or Firm* — Kirton McConkie; Evan R. Witt

(57) ABSTRACT

A package structure and a manufacturing method thereof are provided. The package structure includes an insulation layer, an electronic component and a lead frame unit. The electronic component is embedded within the insulation layer and includes plural conducting terminals. The lead frame unit is embedded within the insulation layer and includes a lead frame and a metallization layer. The metallization layer having a thickness more than 10 μm is disposed on at least a part of the lead frame and electrically connected with at least one of the plural conducting terminals of the electronic component.

20 Claims, 3 Drawing Sheets

PACKAGE STRUCTURE AND MANUFACTURING METHOD THEREOF

CROSS-REFERENCE TO RELATED APPLICATION

This application claims priority to Singapore Patent Application No. 10201811582W, filed on Dec. 24, 2018. The entire content of the above-mentioned patent application is incorporated herein by reference for all purposes.

FIELD OF THE DISCLOSURE

The present disclosure relates to a package structure, and more particularly to a package structure and manufacturing method thereof.

BACKGROUND OF THE DISCLOSURE

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a motherboard or a system circuit board.

Generally, the lead frame is utilized in package structure for supporting and electrical connection. However, the surface material property of the lead frame may have insufficient reaction with chemicals treatment in manufacturing process, and thus affects the adhesion between the lead frame and the materials in-contact therewith. In addition, the delamination is easily happened on the side edges of the lead frame due to more stress concentrated on the side edge and more difficult reaction with chemicals at the side edge.

Therefore, there is a need of providing a package structure and manufacturing method thereof to obviate the drawbacks encountered from the prior arts.

SUMMARY OF THE DISCLOSURE

It is an object of the present disclosure to provide a package structure and manufacturing method thereof. The lead frame unit of the package structure includes a lead frame and a metallization layer disposed on at least a part of the lead frame. Due to the metallization layer, the lead frame unit has good reaction with chemicals treatment in manufacturing process, which results in good adhesion between the lead frame unit and the materials in-contact therewith. Meanwhile, the delamination easily happened on the side edge of the lead frame is avoided. In addition, the thickness of the metallization layer is adjustable. Therefore, it is freer to perform minor adjustment of the lead frame thickness and pattern line and space according to the thickness of the electronic component and package design.

In accordance with an aspect of the present disclosure, there is provided a package structure. The package structure includes an insulation layer, an electronic component and a lead frame unit. The electronic component is embedded within the insulation layer and includes plural conducting terminals. The lead frame unit is embedded within the insulation layer and includes a lead frame and a metallization layer. The metallization layer having a thickness more than 10 μm is disposed on at least a part of the lead frame and electrically connected with at least one of the plural conducting terminals of the electronic component.

In accordance with another aspect of the present disclosure, there is provided a method of manufacturing a package structure. The method includes the following steps. Firstly, an electronic component including plural conducting terminals is provided. Then, a lead frame unit comprising a lead frame and a metallization layer is provided. The metallization layer is disposed on at least a part of the lead frame and having a thickness more than 10 μm. Afterward, an interconnection process is performed to electrically connect the lead frame unit and at least one of the plural conducting terminals. Finally, the electronic component and the lead frame unit is embedded within an insulation layer.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
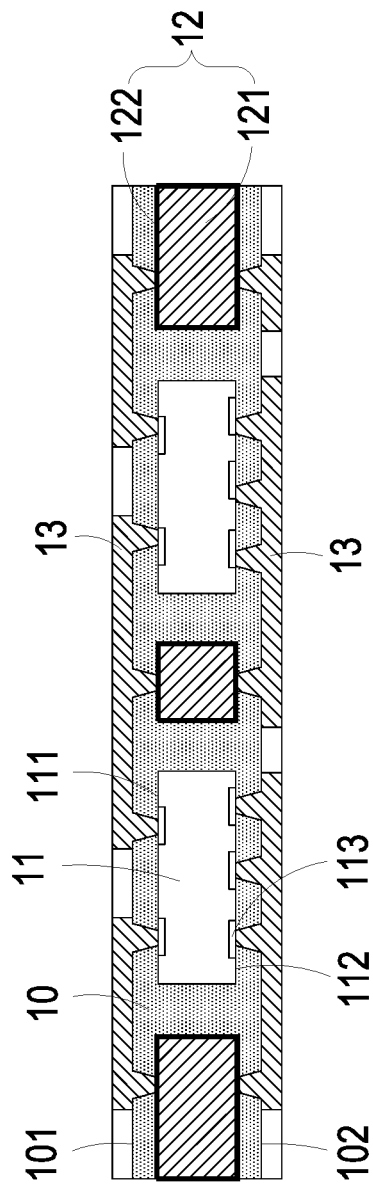
FIG. 1 is a schematic cross-sectional view illustrating a package structure using a lead frame unit according to an embodiment of the present disclosure.

FIG. 1 is a schematic cross-sectional view illustrating a package structure using a lead frame unit according to an embodiment of the present disclosure. As shown in FIG. 1, the package structure 1 includes an insulation layer 10, an electronic component 11 and a lead frame unit 12.

The insulation layer 10 can be made of any appropriate insulation material. The electronic component 11, such as a semiconductor chip, is embedded within the insulation layer 10 and includes a top surface 111, a bottom surface 112 and plural conducting terminals 113. In this embodiment, the conducting terminals 113 are formed on the top surface 111 and the bottom surface 112. In another embodiment, all the conducting terminals 113 can be formed on the same surface, either the top surface 111 or the bottom surface 112.

The lead frame unit 12 is embedded within the insulation layer 10 together with the electric component 11. The lead frame unit 12 includes a lead frame 121 and a metallization layer 122. The metallization layer 122 is disposed on at least a part of the lead frame 121 and electrically connected with at least one of the plural conducting terminals 113 of the electronic component 11. Preferably but not exclusively, the metallization layer 122 is made of a thick copper layer with a thickness between 10 μm and 30 μm. The metallization layer 122 is for example but not limited to be made of copper, tin, silver, nickel, chromium or a combination thereof. In an embodiment, the metallization layer 122 is disposed on at least a part of the lead frame 121 by electroplating. In another embodiment, the whole outer surface of the lead frame 121 is enclosed by the metallization layer 122.

In this embodiment, the package structure 1 further includes two redistribution layers 13. One part of the redistribution layer 13 is disposed on a top surface 101 or a bottom surface 102 of the insulation layer 10, and the other part of the redistribution layer 13 is located in the insulation layer 10 and connected with at least one of the plural conducting terminals 113 and at least a part of the lead frame unit 12.

Due to the metallization layer 122, the lead frame unit 12 has good reaction with chemicals treatment in manufacturing process. Accordingly, the adhesion between the lead frame unit 12 and the insulation layer 10 is strengthened. Meanwhile, the delamination easily happened on the side edge of the lead frame 121 is avoided. Moreover, the thickness of the metallization layer 122 is adjustable. Therefore, it is freer to perform minor adjustment of the thickness of lead frame 121 and pattern line and space according to the thickness of electronic component 11 and package design. In some cases, when the lead frame 121 has a smaller thickness than the electronic component 11, the metallization layer 122 can be used to adjust the thickness of the lead frame unit 12 so as to make top surface of the lead frame unit 12 in the same height as the top surface 111 of the electronic component 11, improving the following process of forming the redistribution layer 13.

Figure 2A:
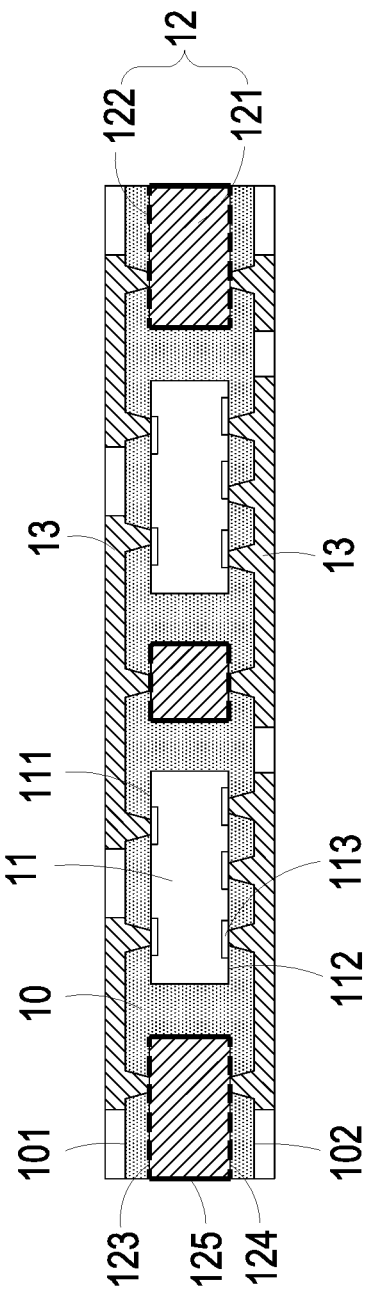
FIGS. 2A, 2B and 2C are schematic cross-sectional views illustrating variant examples of FIG. 1.
Figure 2B:
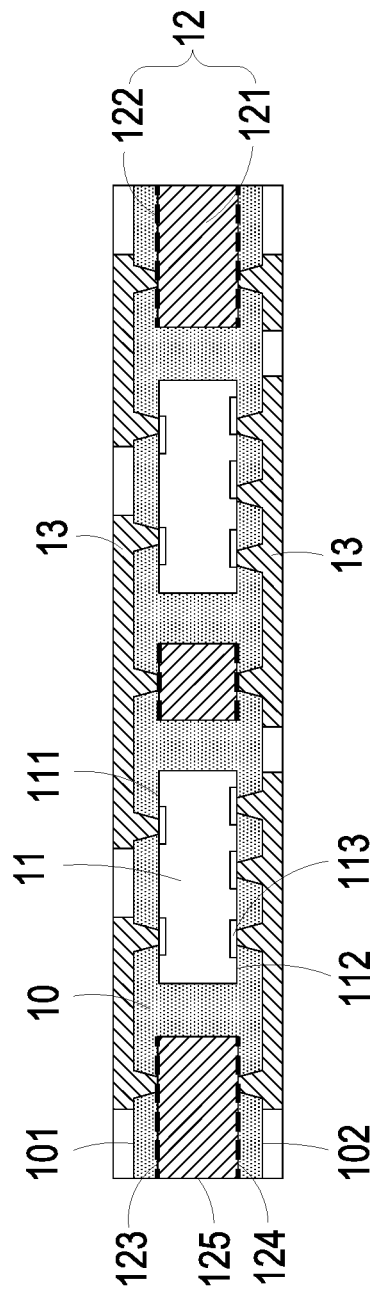
Figure 2C:
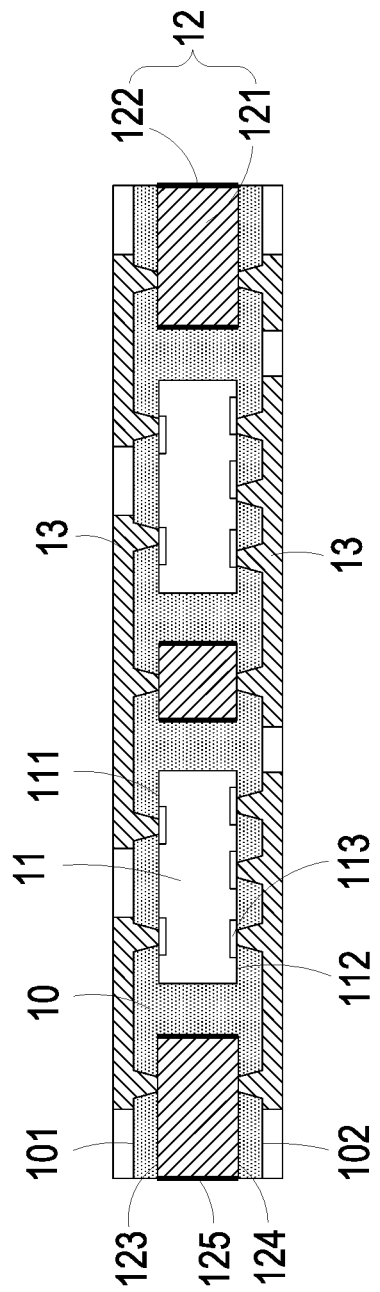

In addition, the position and area of the metallization layer 122 disposed on the lead frame 121 are adjustable according to practical requirements, and are not limited to that shown in FIG. 1. FIGS. 2A, 2B and 2C are schematic cross-sectional views illustrating variant examples of FIG. 1. As shown in FIG. 2A, in this variant example, the metallization layer 122 is disposed on some parts of a top surface 123 of the lead frame 121, some parts of a bottom surface 124 of the lead frame 121, and plural sidewalls 125 of the lead frame 121. As shown in FIG. 2B, in this variant example, the metallization layer 122 is disposed on some parts of the top surface 123 and the bottom surface 124 of the lead frame 121. As shown in FIG. 2C, in this variant example, the metallization layer 122 is disposed on the sidewalls 125 of the lead frame 121.

Figure 3:
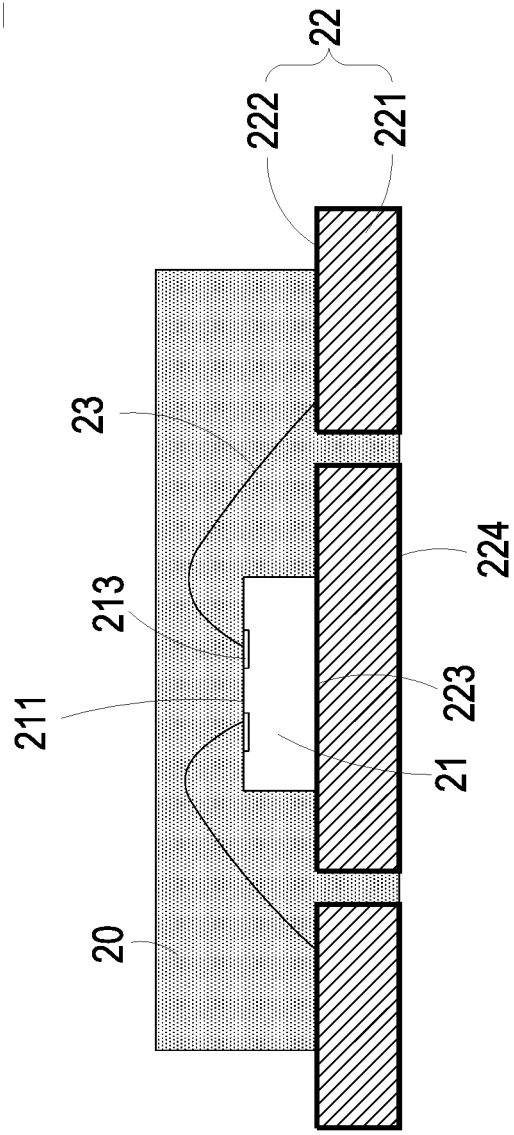
FIG. 3 is a schematic cross-sectional view illustrating a package structure using the lead frame unit according to another embodiment of the present disclosure.

FIG. 3 is a schematic cross-sectional view illustrating a package structure using the lead frame unit according to another embodiment of the present disclosure. As shown in FIG. 3, the package structure 2 includes an insulation layer 20, an electronic component 21 and a lead frame unit 22. The electronic component 21 is embedded within the insulation layer 20 and disposed on the lead frame unit 22. The electronic component 21 includes a top surface 211 and plural conducting terminals 213 formed on the top surface 211. The lead frame unit 22 is embedded within the insulation layer 20 and includes a lead frame 221 and a metallization layer 222. The metallization layer 222 is formed on at least a part of the lead frame 221 and electrically connected with at least one of the plural conducting terminals 213 of the electronic component 21. In this embodiment, the electronic component 21 is disposed on a top surface 223 of the lead frame unit 22, a bottom surface 224 of the lead frame unit 22 is exposed from the insulation layer 20, and the package structure 2 further comprises at least one conducting wire 23. The conducting wire 23 is electrically connected with at least one of the plural conducting terminals 213 and the lead frame unit 22.

Regarding the package structure (1, 2) described above, the process of manufacturing the package structure (1, 2) includes the following steps.

Firstly, an electronic component (11, 21) including plural conducting terminals (113, 213) is provided.

Then, a lead frame unit (12, 22) comprising a lead frame (121, 221) and a metallization layer (122, 222) is provided. The metallization layer (122, 222) is disposed on at least a part of the lead frame (121, 221) and has a thickness more than 10 μm.

Afterward, an interconnection process is performed to electrically connect the lead frame unit (12, 22) and at least one of the plural conducting terminals (113, 213). In an embodiment, a wire bonding process is performed to form a conducting wire 23 electrically connected between the lead frame unit 22 and at least one of the plural conducting terminals 213. In an embodiment, at least one redistribution layer 13 is formed on a top surface 101 or a bottom surface 102 of an insulation layer 10, and electrically connected with the metallization layer 122 of the lead frame unit 12 and at least one of the plural conducting terminals 113.

Finally, the electronic component (11, 21) and the lead frame unit (12, 22) are embedded within an insulation layer (10, 20). In an embodiment, the electronic component 21 is disposed on a top surface 223 of the lead frame unit 22, and a bottom surface 224 of the lead frame unit 22 is exposed from the insulation layer 20.

From the above descriptions, the present disclosure provides a package structure and a manufacturing method thereof. The lead frame unit includes a lead frame and a metallization layer formed on at least a part of the lead frame. Due to the metallization layer, the lead frame unit has good reaction with chemicals treatment in manufacturing process, which results in good adhesion between the lead frame unit and the materials in-contact therewith. Meanwhile, the delamination easily happened on the side edge of the lead frame is avoided. In addition, the thickness of the metallization layer is adjustable. Therefore, it is freer to perform minor adjustment of the lead frame thickness and pattern line and space according to the thickness of the electronic component and package design.

While the disclosure has been described in terms of what is presently considered to be the most practical and preferred embodiments, it is to be understood that the disclosure needs not be limited to the disclosed embodiment.

What is claimed is:

1. A package structure, comprising:
   an insulation layer;
   an electronic component embedded within the insulation layer, and comprising plural conducting terminals; and
   a lead frame unit embedded within the insulation layer, comprising:
   a lead frame; and
   a metallization layer having a thickness more than 10 μm disposed on at least a part of the lead frame and electrically connected with at least one of the plural conducting terminals of the electronic component.

2. The package structure according to claim 1, wherein the metallization layer is disposed on at least a part of a top surface of the lead frame.

3. The package structure according to claim 1, wherein the metallization layer is disposed on at least a part of a bottom surface of the lead frame.

4. The package structure according to claim 1, wherein the metallization layer is disposed on at least a part of plural sidewalls of the lead frame.

5. The package structure according to claim 1, wherein the metallization layer is disposed on a whole outer surface of the lead frame.

6. The package structure according to claim 1, wherein the thickness of the metallization layer is smaller than 30 µm.

7. The package structure according to claim 1, wherein the metallization layer is disposed on at least a part of the lead frame by electroplating.

8. The package structure according to claim 1, wherein the metallization layer is made of copper, tin, silver, nickel, chromium or a combination thereof.

9. The package structure according to claim 1, further comprising two redistribution layers, wherein one part of the redistribution layer is disposed on a top surface or a bottom surface of the insulation layer, and the other part of the redistribution layer is located in the insulation layer and connected with at least one of the plural conducting terminals and at least a part of the lead frame unit.

10. The package structure according to claim 1, wherein the electronic component is disposed on a top surface of the lead frame unit, a bottom surface of the lead frame unit is exposed to the insulation layer, the package structure further comprises at least one conducting wire, and the conducting wire is electrically connected with at least one of the plural conducting terminals and the lead frame unit.

11. A method of manufacturing a package structure, comprising steps of:
   (a) providing an electronic component comprising plural conducting terminals;
   (b) providing a lead frame unit comprising a lead frame and a metallization layer, the metallization layer being disposed on at least a part of the lead frame and having a thickness more than 10 µm;
   (c) performing an interconnection process to electrically connect the lead frame unit and at least one of the plural conducting terminals; and
   (d) embedding the electronic component and the lead frame unit within an insulation layer.

12. The method according to claim 11, wherein in the step (b), the metallization layer is disposed on at least a part of a top surface of the lead frame.

13. The method according to claim 11, wherein in the step (b), the metallization layer is disposed on at least a part of a bottom surface of the lead frame.

14. The method according to claim 11, wherein in the step (b), the metallization layer is disposed on at least a part of plural sidewalls of the lead frame.

15. The method according to claim 11, wherein in the step (c), a wire bonding process is performed to form a conducting wire electrically connected between the lead frame unit and at least one of the plural conducting terminals.

16. The method according to claim 11, wherein the thickness of the metallization layer is smaller than 30 µm.

17. The method according to claim 11, wherein the electronic component is disposed on a top surface of the lead frame unit, and a bottom surface of the lead frame unit is exposed to; the insulation layer.

18. The method according to claim 11, wherein in the step (b), the metallization layer is disposed on at least a part of the lead frame by electroplating.

19. The method according to claim 11, wherein the metallization layer is made of copper, tin, silver, nickel, chromium or a combination thereof.

20. The method according to claim 11, wherein in the step (c), at least one redistribution layer is formed on a top surface or a bottom surface of the insulation layer, and electrically connected with the metallization layer of the lead frame unit and at least one of the plural conducting terminals.

* * * * *